United States Patent
Kwo et al.

(10) Patent No.: US 7,678,633 B2
(45) Date of Patent: Mar. 16, 2010

(54) METHOD FOR FORMING SUBSTRATES FOR MOS TRANSISTOR COMPONENTS AND ITS PRODUCTS

(75) Inventors: Juei-Nai Kwo, Hsinchu (TW); Ming-Hwei Hong, Hsinchu (TW); Wei Chin Lee, Taipei (TW); Hsiang Pi Chang, Yonghe (TW); Yan Dar Wu, Taipei (TW); Kun Yu Lee, Tainan (TW); Yi Jiun Lee, Lunbei Township, Yunlin County (TW)

(73) Assignee: National Tsing Hua University, Hsinchu (TW)

( * ) Notice: Subject to any disclaimer, the term of this patent is extended or adjusted under 35 U.S.C. 154(b) by 616 days.

(21) Appl. No.: 11/603,750

(22) Filed: Nov. 22, 2006

(65) Prior Publication Data

US 2007/0117407 A1    May 24, 2007

(30) Foreign Application Priority Data

Nov. 24, 2005    (TW) .............................. 94141332 A

(51) Int. Cl.
*H01L 29/72*    (2006.01)
(52) U.S. Cl. ...................................... 438/197; 438/199
(58) Field of Classification Search ................. 438/197, 438/199
See application file for complete search history.

(56) References Cited

U.S. PATENT DOCUMENTS 5,434,100 A    7/1995   Nakamura et al.
6,514,828 B2 *  2/2003   Ahn et al. .................... 438/297
7,037,862 B2 *  5/2006   Ahn et al. .................... 438/785
7,374,964 B2 *  5/2008   Ahn et al. .................... 438/104
7,393,736 B2 *  7/2008   Ahn et al. .................... 438/197
2004/0110391 A1 * 6/2004  Ahn et al. .................... 438/778
2004/0175882 A1 * 9/2004  Ahn et al. .................... 438/240

(Continued)

FOREIGN PATENT DOCUMENTS

CN            094123194           7/1994

(Continued)

OTHER PUBLICATIONS

Search Report of Taiwanese Patent Office of Priority Application No. 094141332.

(Continued)

*Primary Examiner*—Thao P. Le
(74) *Attorney, Agent, or Firm*—Bucknam and Archer

(57) ABSTRACT

The present invention provides a method for forming substrates for MOS (metal oxide semiconductor) transistor, comprising the following steps: (A) In a reduced-pressure environment having a pressure lower than $1\times10^{-6}$ Torr, a base for accomplishing the surface reconstruction and a solid-state metal oxide source is provided, wherein the solid-state metal oxide source is chosen from the group consisting of the following: hafnium oxide, aluminum oxide, scandium oxide, yttrium oxide, titanium oxide, gallium gadolinium oxide and metal oxides of rare earth elements; and (B) vaporize the solid-state metal oxide source in order to make the solid-state metal oxide source become a metal oxide molecular beam and, in a working substrate temperature that is required to achieve an amorphous state of a first metal oxide film, deposit on the base having an amorphous state so as to further fabricate a substrate for MOS transistors.

26 Claims, 10 Drawing Sheets hafnium oxide gallium arsenide base

U.S. PATENT DOCUMENTS

| | | | |
|---|---|---|---|
| 2005/0020017 A1* | 1/2005 | Ahn et al. | 438/287 |
| 2005/0023602 A1* | 2/2005 | Forbes et al. | 257/315 |
| 2005/0023624 A1* | 2/2005 | Ahn et al. | 257/410 |
| 2005/0164521 A1* | 7/2005 | Ahn et al. | 438/778 |
| 2005/0215015 A1* | 9/2005 | Ahn et al. | 438/287 |
| 2005/0218462 A1* | 10/2005 | Ahn et al. | 257/410 |
| 2005/0227442 A1* | 10/2005 | Ahn et al. | 438/287 |
| 2006/0163655 A1* | 7/2006 | Hoffman et al. | 257/347 |
| 2006/0176645 A1* | 8/2006 | Ahn et al. | 361/311 |
| 2007/0010060 A1* | 1/2007 | Forbes et al. | 438/287 |
| 2007/0128905 A1* | 6/2007 | Speakman | 439/161 |

FOREIGN PATENT DOCUMENTS

| | | |
|---|---|---|
| TW | 468212 | 12/2001 |
| TW | I228789 | 3/2005 |
| WO | WO 02/41371 A1 | 5/2002 |

OTHER PUBLICATIONS

Frank, Martin M., et al., "HfO$_2$ and Al$_2$O$_3$ gate dielectrics on GaAs grown by atomic layer deposition" *Applied Physics Letters* 86, 152904 (2005).

Koveshnikov, S. et al. "Metal-oxide-semiconductor capacitors on GaAs with high-*k* gate oxide and amorphous silicon interface passivation layer", *Applied Physics Letters* 88, 022106 (2006).

InJo Ok, et al. "Metal Gate-Hf0$_2$ MOS Structures on GaAs Substrate With and Without Si Interlayer", *IEEE Electron Device Letters*, vol. 27, No. 3, Mar. 2006.

Park, Hong Bae, et al. "Comparison of HfO$_2$ films grown by atomic layer deposition using HfCl$_4$ and H$_2$0 or O3 as the oxidant" *Journal of Applied Physics*, vol. 94, No. 5, pp. 3641-3647, Sep. 2003.

Copel, M."Structure and stability of ultrathin zirconium oxide layers on Si(001)", *Applied Physics Letters*, vol. 76, No. 4, pp. 436-438, Jan. 2000.

Hoshino, Y. "Characterization and control of the HfO$_2$/Si(001) interfaces" *Applied Physics Letters*, vol. 81, No. 14, pp. 2650-2652, Sep. 2002.

Kang, Chang Yong "Effects of dielectric structure of HfO$_2$ on carrier generation rate in Si substrate and channel mobility" *Applied Physics Letters*, vol. 84, No. 12, pp. 2148-2150, Mar. 2004.

Shahrjerdi, Davood, "Unpinned metal gate/high-*k* GaAs capacitors: Fabrication and characterization" *Applied Physics Letters* 89, 2006.

* cited by examiner

METHOD FOR FORMING SUBSTRATES FOR MOS TRANSISTOR COMPONENTS AND ITS PRODUCTS

FIELD OF THE INVENTION

The present invention relates to a method for forming a substrate for transistor components and in particular relates to a method for forming a substrate for MOS (Metal-Oxide-Semiconductor) transistors.

BACKGROUND OF THE INVENTION AND PRIOR ART

The invention of the semiconductor integrated circuit has changed the life style of human being, and made the electronic information industry developing rapidly. Today, while there is an increasing demand on the operational clock rate of the integrated circuits, the size of the electronic product in the integrated circuits has become much smaller and lighter. Because the make-up of the semiconductor components and circuits is mainly based on metal-oxide-semiconductor field-effect-transistors (MOSFET's) which have a gate to serve as a control electrode, that is, the output characteristics of the transistor are controlled by the voltage signal of the gate, in which, if the gate oxide gets thinner, the driving current will become larger and the speed of the integrated circuit will become faster; therefore the efficiency of the component can be enhanced and the energy consumption can be reduced. Hence, it is a definite trend toward reducing the gate oxide thickness in order to reduce the size of the component and/or increase the device speed.

However, if the thickness of currently used silicon dioxide is less than 10°A, the leakage current density caused by the quantum tunneling effect can be larger than 1 to 10 A/cm$^2$; therefore, the insulating characteristics cannot be maintained. Alternative gate oxides with high dielectric constants ($\kappa$) are now urgently sought after. Some common high $\kappa$ dielectrics are yttrium oxide ($Y_2O_3$), hafnium oxide ($HfO_2$), tantalum oxide ($Ta_2O_3$), zirconium oxide ($ZrO_2$), lanthanum oxide ($La_2O_3$), and titanium oxide ($TiO_2$), etc.

Usually, to grow a high $\kappa$ dielectric film, the known art includes, for example, the methods of Chemical Vapor Deposition (CVD), Atomic Layer Chemical Vapor Deposition (ALCVD), Metal Organic Chemical Vapor Deposition (MOCVD), Pulsed-Laser Deposition (PLD), and Sputtering, etc. When using those methods to grow high $\kappa$ dielectrics directly on a single crystal semiconductor substrate, it is inevitable to form an interfacial layer of low $\kappa$ silicon oxide and/or silicate, with a dielectric constant very close to 4 of silicon dioxide. Consequently, the equivalent oxide thickness (EOT) of the gate dielectrics will become larger, which will in turn decrease the overall value of the dielectric constant. Hence, the efficiency of MOS transistors can not be effectively improved.

Additionally, the method of the traditional molecular beam epitaxy (MBE) may also be used to form a metal oxide and then deposit the metal oxide on the substrate by means of the vapor phase composition to form the metal oxide (i.e., a method in which the metal is used as a source of vapor deposition; and then during the vapor deposition process oxygen is injected to make metal react with oxygen so as to accomplish the vapor phase composition). However, while oxygen is injected, the surface of the substrate will be oxidized to form a native oxide film, which also has the same problem as described above.

Among the methods for producing a metal-oxide layer of the gate as mentioned above, the sputtering method is commonly used due to the advantages of the simplified manufacturing process, lower price, and easy to be industrially mass-produced. However, because plasma must be used during the sputtering process, and the collision of the particles in the plasma will cause the base to accumulate much more energies, hence an inevitable formation of an interfacial oxide approximately over 1.9 nm. This has posed the technical difficulty of reducing the thickness of overall high k gate dielectrics.

ALCVD, with superior properties, such as accurate film thickness control, fine covering property of the aspect ratio structure, low-temperature film forming method, feasibility of multi-layer structure, and excellent uniformity for large-scale areas, has been applied to deposit high k gate dielectrics. However, a good starting surface to deposit the high-quality oxide films is required due to the fundamental mechanism of ALD. It is widely accepted that the hydroxyl groups (OH) on silicon surface play an important role as nucleation sites in the high k dielectrics growth by ALD. When the dielectric is directly deposited on HF-cleaned silicon, the gate leakage current is higher and the dielectric is more unstable than those grown on $SiO_2$ layer. This is owing to the non-stoichiometic SiOx forming between oxide and silicon interface during ALD process. An interfacial modification of the Si substrate is critical for achieving excellent ALD grown high k gate dielectrics.

Therefore, how to prevent the interfacial layer formation or to reduce substantially the interfacial layer thickness so as to achieve low EOT, defined as $\kappa_{SiO2*}$ (thickness of high $\kappa$ dielectrics)/($\kappa_{high\,\kappa}$), is a problem eagerly to be solved by the researchers in the field of the MOSFET manufacturing technology.

SUMMARY OF THE INVENTION

In R.O.C. Patent Application Ser. No. 094123194, the applicants disclosed a method for producing a substrate having a single crystal scandium oxide for epitaxial growth. In the application, a molecular beam epitaxy method (different from the above discussed traditional molecular beam method) is used to vaporize a solid-state scandium oxide source in order to let the scandium oxide source, which is in a solid-state, to directly deposit, in the form of oxide molecule or its clusters, on a single crystal semiconductor so as to produce a scandium oxide film having a single crystal structure.

In that application, oxygen source is not put in during the film formation process. Only the solid-state scandium oxide source is heated directly and then vaporized in order to form a molecular-state scandium oxide. To conclude from the previous description, using the molecular beam epitaxy method to vaporize metal oxide source being in a solid-state can provide a film-forming environment with an ultra low oxygen content for the film-forming process, and is advantageous to form a substrate for MOS transistors.

Hence, in the present invention, the molecular beam epitaxy method is utilized in a reduced pressure environment having a pressure of $1 \times 10^{-6}$ Torr to vaporize a solid-state metal-oxide source having high purity to deposit, for the purpose of serving as a substrate for MOSFET, a first metal-oxide film in an amorphous state on the surface of a base semiconductor, wherein the superficial native oxide film of the base has been removed and the surface reconstruction of the base has been accomplished.

In comparison with the traditional molecular beam epitaxy method, which forms a metal oxide by means of vapor phase composition and therefore is possible to re-oxidize, during the process of putting in the oxygen, the surface of the base to form a native oxide film, the present invention, on the contrary, utilize the method of direct vapor deposition of the metal-oxide source to ensure that the metal oxide will arrive at the surface of the base in the form of micelle to complete the deposition process; and as the metal-oxide film is formed in a reduced pressure environment having a pressure lower than $1 \times 10^{-6}$ Torr, oxidization of the surface of the base can be prevented certainly, and the probability of the occurrence of the interfacial layer between the metal oxide and the base can be suppressed. Additionally, the operating temperature is kept under the re-crystallization temperature of the metal oxide in order to preclude the possibility that the first metal-oxide film may form in the crystal state such that the dielectric property is affected.

Because there is no interfacial oxide film existing on the above-mentioned substrate, which is covered with the first metal-oxide film, on the one hand the first metal-oxide film can be used directly as an oxide layer for the gate; on the other hand, a second metal-oxide film may, by using the film coating method (such as radio frequency sputtering method, ALCVD, MOCVD, and PLD, etc.), be further deposited on top of the first metal-oxide film to form an inventive substrate for MOSFET's.

In addition, because the surface of the substrate is covered with the first oxide film already, which ensures that the surface of the substrate will not directly contact with the oxygen or oxygen ion in the environment during the film formation process of the second metal-oxide film, therefore the forming of the interfacial oxide layer can be avoided or at least the thickness of the interfacial oxide layer can be substantially reduced, wherein the second metal-oxide film and the first metal-oxide film may be made by the same material or made by different kinds of materials. In the present invention, for example, the radio frequency (RF) sputtering method and ALVCD are used to illustrate the inventive concept.

It is worth noting that, because the target material is a metal oxide which can provide an oxygen source while the second metal-oxide film is deposited by using the method of sputtering, therefore the plasma will contain oxygen ions. However, in the present invention, since the base is protected by the first metal-oxide film, the surface of the base will not contact with the oxygen ions directly during the deposition process of the second metal-oxide film. Although, due to the high energy provided by the plasma, some of the oxygen ions may compose with the surface of the base through diffusion so as to form an interfacial layer, however, in comparison with the known art that forms a film by directly using the RF sputtering method, the inventive method can substantially reduce the thickness of the interfacial layer.

Besides, during the ALCVD process, the characteristic of the substrate is a crucial factor to the determination of the quality of the formed film. The present invention utilizes the MBE method and directly vaporizes the solid-state metal-oxide source to produce the first metal-oxide film, which can provide an excellent diffusion barrier for the subsequently deposited second metal-oxide film. Furthermore, the first metal-oxide film can provide a superior nucleation surface, and prevent the surface of the base from directly contacting with water vapor and forming an interfacial layer. Thus, the first metal-oxide film has all the effects of the diffusion layer, nucleation layer and protection layer.

Hence, the purpose of the present invention is to provide a method for forming a substrate for MOSFET's, and in particular a method for forming a substrate for MOSFET's, wherein the method, during the film formation process of the deposition of the metal-oxide film having a high dielectric constant, is able to prevent the surface of the base from forming an interfacial layer.

A further objective of the present invention is to provide a substrate that is produced by the method for forming a substrate for MOS transistors as described above.

Therefore, the inventive method for forming substrates for MOSFET comprises the following steps:
(A) in a reduced-pressure environment having a pressure lower than $1 \times 10^{-6}$ Torr, wherein the solid-state metal oxide source is chosen from the group consisting of the following: hafnium oxide ($HfO_2$), aluminum oxide ($Al_2O_3$), scandium oxide ($Sc_2O_3$), yttrium oxide ($Y_2O_3$), titanium oxide ($TiO_2$), gallium gadolinium oxide ($Ga_2O_3(Gd_2O_3)$) and metal-oxides of rare earth elements; and
(B) vaporize the solid-state metal oxide source in order to make the solid-state metal oxide source become a metal oxide molecular beam and, in a operating temperature that is required to form an amorphous phase of the solid-state metal oxide source, deposit on the base a first metal oxide film having an amorphous state so as to further fabricate a substrate for MOS transistors.

DETAILED DESCRIPTION OF THE INVENTION

The inventive method for forming substrates for MOSFET comprises the following steps:
(A) in a reduced-pressure environment having a pressure lower than $1 \times 10^{-6}$ Torr, wherein the solid-state metal oxide source is chosen form the group consisting of the following: hafnium oxide, aluminum oxide, scandium oxide, yttrium oxide, titanium oxide, gallium gadolinium oxide and metal-oxides of rare earth elements; and
(B) vaporize the solid-state metal oxide source in order to make the solid-state metal oxide source become a metal oxide molecular beam and, in a operating temperature that is required to form an amorphous phase of the solid-state metal oxide source, deposit on the base a first metal oxide film having an amorphous state so as to further fabricate a substrate for MOS transistors.

The solid-state metal oxide source suitable for the step (A) in the present invention is one of the hafnium oxide and aluminum oxide; and the operating temperature for the step (B) is ranging from 25° C. to 100° C., and the solid-state metal-oxide source is vaporized by an electron gun (e-gun).

The base suitable for the step (A) in the present invention is one of the single crystal silicon and single crystal compound semiconductors. The single crystal compound semiconductors consist of a Group 13 element and a Group 15 element, in which the Group 13 element is selected from the group comprising the following: boron (B), aluminum (Al), gallium (Ga), indium (In), thallium (Tl) and a combination thereof; and the Group 15 element is selected from the group comprising the following: nitrogen (N), phosphorus (P), arsenic (As), antimony (Sb), bismuth (Bi), and a combination thereof. In a preferred embodiment, the base used in the step (A) is single crystal silicon.

Furthermore, following the step (B), a step (C) is further included. The step (C) is to stack a second metal-oxide film over the first metal-oxide film, wherein the second metal-oxide film is selected from the group consisting of the following: hafnium oxide, aluminum oxide, scandium oxide, yttrium oxide, titanium oxide, gallium gadolinium oxide and metal-oxides of rare earth elements.

In a preferred embodiment of the present invention, in the step (C), the second metal oxide film is being stacked over the first metal-oxide film by the radio frequency (RF) sputtering method, wherein the sputtering energy of the RF sputtering method is absorbed by the base so as to form an interfacial oxide layer, with a thickness less than 1.8 nm, between the base and the first metal-oxide film. Preferably, the thickness of the interfacial oxide layer is between 0.3 nm and 1.8 nm; the operating temperature of the step (C) is between 25° C. and 300° C.; the RF sputtering method in the step (C) is to apply an output power ranging from 20 W to 100 W over a metal-oxide target material; the operating pressure of the step (C) is between 5 mTorr and 50 mTorr. More preferably, the operating temperature of the step (C) is between 150° C. and 250° C.; the output power in the step (C) is ranging from 30 W to 60 W.

In a further embodiment of the present invention, in the step (C), the second metal oxide film is being stacked over the first metal-oxide film by the Atomic Layer Chemical Vapor Deposition (ALCVD) method. Preferably, the operating temperature of the step (C) is between 25° C. and 400° C.; the operating pressure of the step (C) is between 0.1 Torr and 10 Torr. More preferably, the operating temperature of the step (C) is between 200° C. and 300° C.

In another preferred embodiment of the present invention, the base in the step (A) is a single-crystal composition semiconductor, in which the Group 13 element is gallium and the Group 15 element is arsenic; furthermore, a step (A') and a step (A") are included in between the step (A) and the step (B). In the step (A'), a single crystal gallium arsenide film, which is doped with a dopant having a doping concentration in the range from of $5\times10^{15}$ to $3\times10^{18}/cm^3$ in n-type and $5\times10^{15}$ to $2\times10^{19}$/cm3 in p-type, is epitaxially grown on the base with a thickness ranging from 50 nm to 250 nm; in the step (A"), a surface reconstruction is applied over the single crystal gallium arsenide film. Preferably, in the step (A'), the thickness of the gallium arsenide film is ranging from 100 nm to 200 nm, and the doping concentration is the same as above.

Preferably, in the step (A), the pressure of the reduced pressure environment is ranging from $1\times10^{-7}$ Torr to $1\times10^{-10}$ Torr. More preferably, in the step (A), the pressure of the reduced pressure environment is ranging from $1\times10^{-8}$ Torr to $1\times10^{-10}$ Torr.

BRIEF DESCRIPTION OF THE DRAWINGS

For the above-described and other technical details, features, and effectiveness related to the present invention, they will be clearly seen in the following four preferred embodiments of the present invention which will be subsequently described by referring to the enclosing drawings, wherein.

DETAILED DESCRIPTION OF THE PREFERRED EMBODIMENTS

Embodiment 1

A first embodiment of the inventive method for forming a substrate for MOSFET is described as follows.

For a silicon base having a crystal plane index equal to (100), a regular and standard cleaning procedure (RCA-clean) was used to remove impurities, such as particles or organic contaminants, in advance on the surface of the silicon base; and then hydrofluoric acid (HF) wet etching was further used to remove the native oxide (SiO$_2$) layer on top of the surface of the silicon base. The soaking (etching) time should be lower than 20 seconds in order to avoid over-etching which may result in the roughness of the surface of the silicon base.

The test specimen was put into an loadlock chamber of a multi-chamber ultra high vacuum molecular beam epitaxy (MBE) system. If the pressure of the loadlock chamber is lower than $1\times10^{-8}$ Torr, the test specimen was then transfer to an oxide chamber having a vapor deposition source of pure powder-packed hafnium oxide. The pressure inside the first chamber is kept approximately under $10^{-9}$ Torr in order to ensure the cleanness of the surface of the base and prevent generation of the silicon dioxide interface layer. The test specimen is subsequently heated in this ultra-high vacuum system to a temperature approximately higher than 550° C., and then maintained at a temperature of 580° C. for no more than 5 minutes in order to perform a surface reconstruction of the surface of the base, observed using in-situ Reflection High Energy Electron Diffraction (hereinafter will be abbreviated to RHEED).

Figure 1:
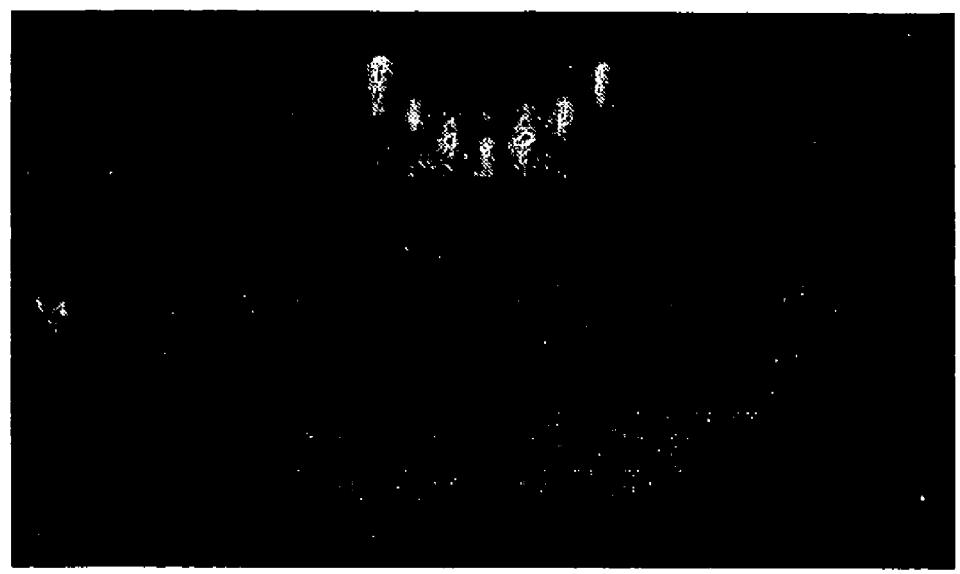
FIG. 1 shows a RHEED diagram of a silicon base after the surface reconstruction is completed in a first embodiment of the present invention.

FIG. 1 of a 2×1 RHEED pattern shows a silicon base in a state that its surface is extremely clean after the native oxide on the surface is removed.

Next, the temperature in the oxide chamber is reduced to a low temperature around 25° C. to 60° C. During the cooling process, the pressure inside the chamber is kept under $1 \times 10^{-9}$, and the test specimen is turned away from the deposition position. Then the electron gun in the chamber is turned on to vaporize the vapor deposition source of hafnium oxide. When the power (approximately 1 kW) of the electron beam is stabilized, the test specimen is turned back into the deposition position so as to deposit a first metal-oxide film (hafnium oxide film) op top of the silicon base. At this moment, the operating temperature of the test specimen is still kept in between 25° C. to 60° C., while the operating pressure is increased to $5 \times 10^{-8}$ Torr because of the action of the electron beam on the hafnium-oxide vapor deposition source. The operating temperature during the film formation process is then maintained at $5 \times 10^{-8}$ Torr to prevent the silicon base thoroughly from oxidizing. By doing so, it can be guaranteed that no interface layer will be formed in between the first metal-oxide layer and the silicon base, and therefore the value of EOT can be reduced.

Figure 2:
FIG. 2 shows a RHEED diagram after a first metal-oxide film is formed in the first embodiment of the present invention.

After the film formation process of the first metal-oxide film is accomplished, the recognition of the RHEED image, as shown in FIG. 2, can be used to identify that the first metal-oxide film was actually grown on the surface of the silicon base in an amorphous state. The phase of the amorphous material can reduce the value of the leakage current.

Figure 3:
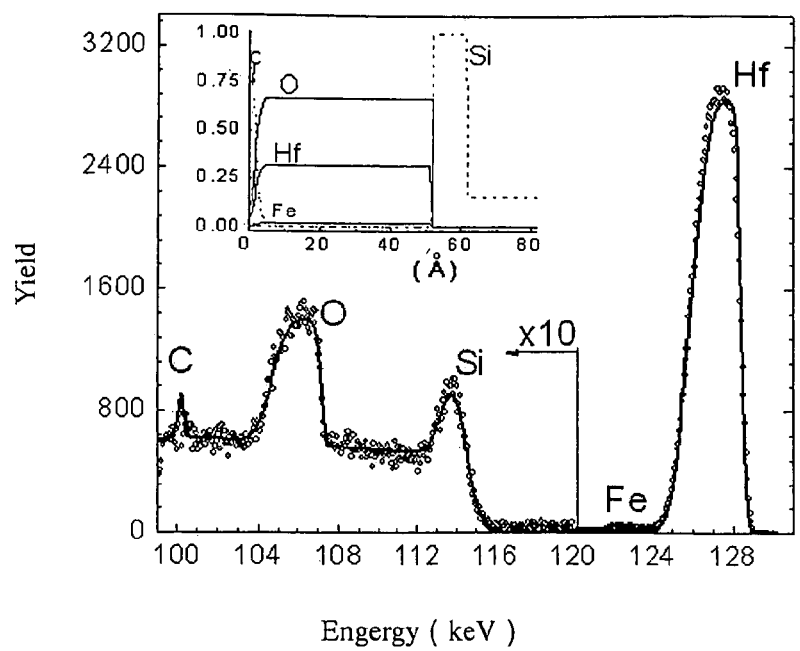
FIG. 3 shows a measurement diagram of the Medium Energy Ion Scattering (MEIS) spectroscopy in the first embodiment of the present invention after the first metal-oxide film is formed.

FIG. 3 shows a diagram depicting the analysis result of the Medium Energy Ion Scattering (MEIS) spectroscopy for the first embodiment, and a depth profile analysis of the diagram. As it can be seen from this figure, there are abrupt changes between the hafnium oxide film and the silicon base for silicon (Si), oxygen (O), and hafnium (Hf) signals, from which it is concluded that there is no silicon dioxide film forming in the junction between the silicon base and the hafnium oxide film.

Figure 4:
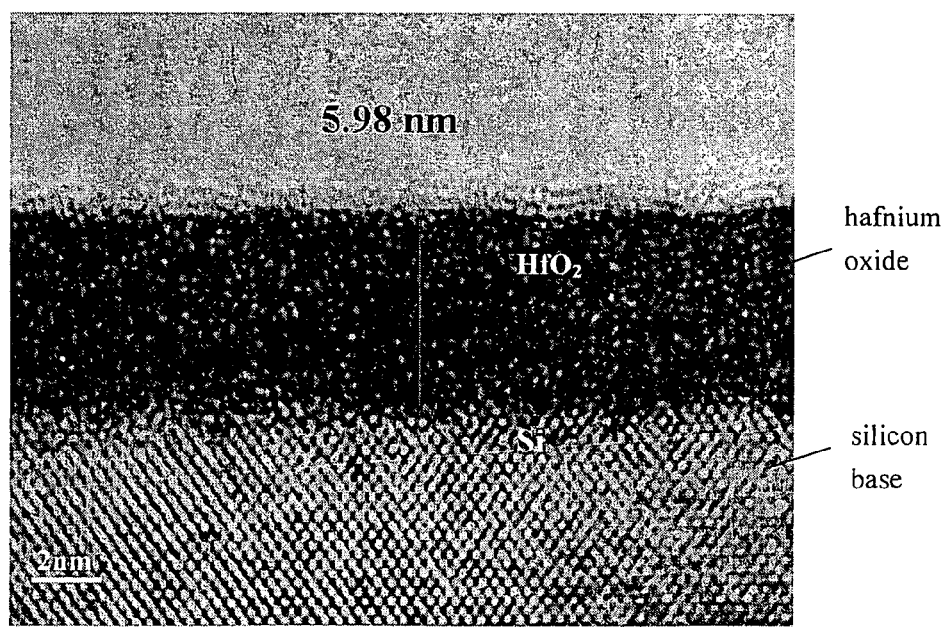
FIG. 4 shows a High Resolution Transmission Electron Microscopy (HRTEM) image in the first embodiment of the present invention.

From the image of the High Resolution Transmission Electron Microscopy (hereafter will be abbreviated to HRTEM), as shown in FIG. 4, it can be seen that, because the hafnium oxide is directly vaporized by the electron beam and then the hafnium oxide is deposited on the surface of the base in the form of molecular beams formed by the micelles, there is no silicon dioxide film forming in between the hafnium oxide film (with a thickness of approximately 5.98 nm) and the silicon base (on top of the hafnium oxide film is a protection film of macromolecular materials); hence a unique and abrupt hetero-junction without an intermediate layer can be obtained, which indicates that the present invention can maintain the complete spotlessness and flatness of the interface, and further certify the result shown in FIG. 3.

Embodiment 2

A second preferred embodiment of the inventive method for forming a substrate for MOS transistors is described as follows.

First, deposit a first metal-oxide film (hafnium oxide film) on top of the silicon base by using the same step as described in the first preferred embodiment, and then transfer the test specimen form the multi-chamber MBE system into a RF sputtering system which has a ceramic hafnium-oxide target material inside and has a background pressure of $5 \times 10^{-7}$ Torr, wherein the test specimen is maintained at an operating temperature of about 200° C., and is set up in the off-axis sputtering position of the ceramic hafnium-oxide target material so as to reduce the bombardment energy resulting from the collision between the particles and the surface of the test specimen. Furthermore, argon (Ar) is pumped into the interior of the chamber so as to keep the operating pressure at about 10 mTorr, and furthermore an output power of 50 W is applied to the ceramic hafnium-oxide target material in order to form a second metal-oxide film on top of the first metal-oxide film.

Figure 5:
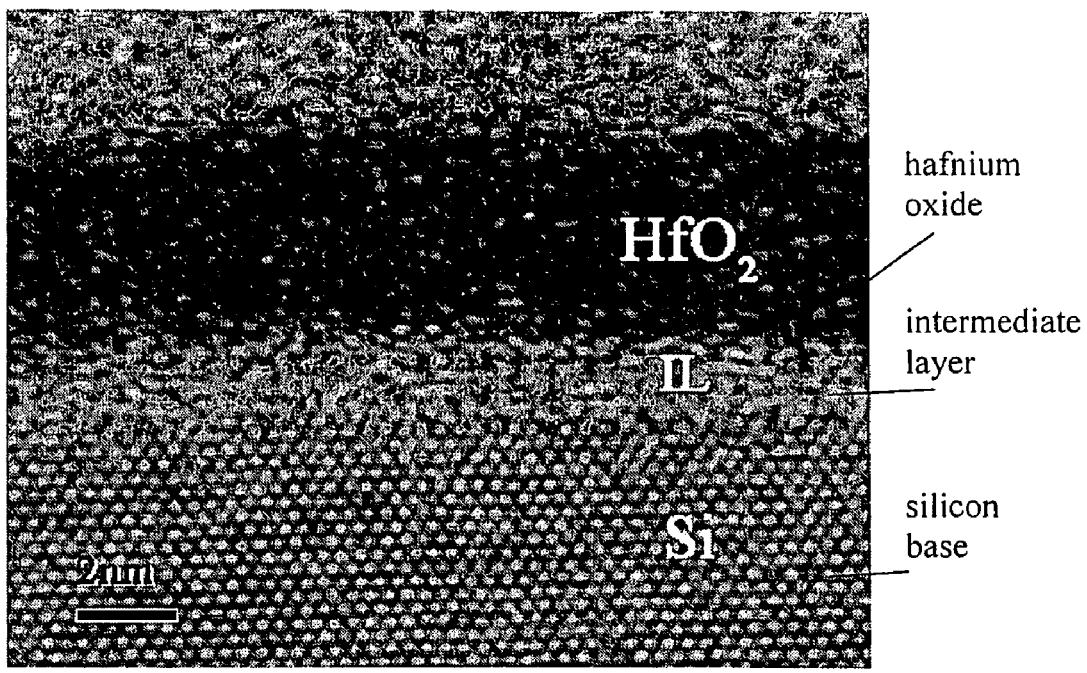
FIG. 5 shows a High Resolution Transmission Electron Microscopy (HRTEM) image in a second embodiment of the present invention.

As it can be seen from the HRTEM image in FIG. 5, the upper layer is a hafnium-oxide film having a thickness of approximately 5 nm, the lower layer is the silicon base, and the intermediate layer is silicon dioxide (i.e., the native oxide film) having a thickness of approximately 0.9 nm, which is formed because of the sputtering energy adsorbed by the surface of the base during the sputtering process. Because of the plasma effect, more energies may be acquired by the surface of the base, which will help the diffusion of the oxygen so as to form silicon dioxide on the surface of the base; however, the thickness of the interfacial oxide layer is much less in comparison with the usual approach that directly sputters a oxide film on the surface of the silicon base such as, for example, a comparative example 1 which uses a silicon base with the native oxide being removed to serve as a substrate and then, under the same condition and process parameter as in the RF sputtering step of the second embodiment, deposit a hafnium-oxide film on top of the silicon base.

Figure 6:
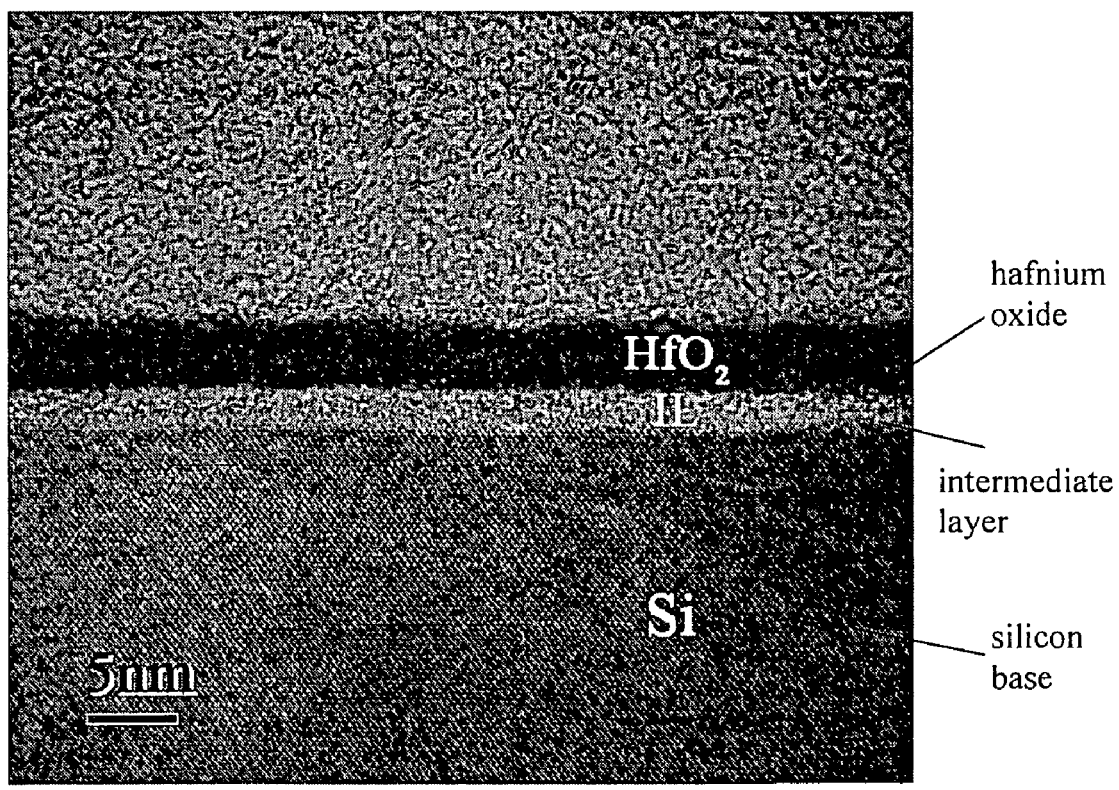
FIG. 6 shows a High Resolution Transmission Electron Microscopy (HRTEM) image in a comparative example.

As shown in FIG. 6 which is a HRTEM image of the comparative example 1, it has a structure which is similar to FIG. 5, where the thickness of the upper layer hafnium-oxide film is about 4.04 nm; but the thickness of the intermediate layer (silicon dioxide) is about 1.93 nm which is obviously thicker than the one in the second embodiment by 0.9 nm. This proves that the first metal-oxide of the present invention indeed has the effect of protection, and is capable of avoiding the surface of the base to directly contact with the oxygen radicals in the plasma so as to substantially reduce the thickness of the native oxide film (silicon dioxide layer).

The electrical property analysis of the substrate, produced by the inventive method in the second embodiment of the present invention, for MOS transistors is briefly described in the following.

First, use the test specimens in the second embodiment and the comparative example, respectively, as the substrate, and then coat a circular-shaped aurum (Au) layer with a 0.1 mm diameter to serve as an electrode. Moreover, the electrical properties of the metal-oxide films in the second embodiment and the comparative example 1 are tested, respectively, in which the measurement structures both in the second embodiment and the comparative example 1 are: metal layer (Au)/metal-oxide film ($HfO_2$)/semiconductor layer (single crystal silicon base)/metal layer (Au).

Figure 7:
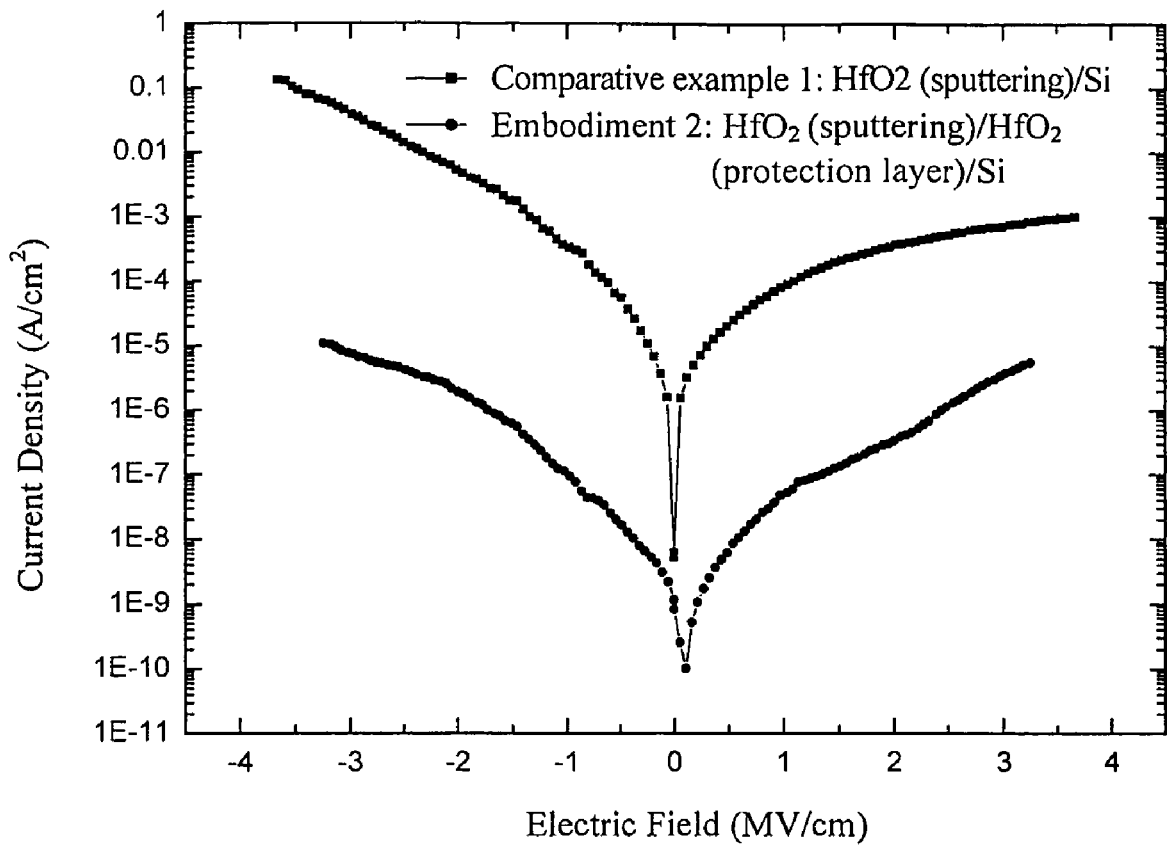
FIG. 7 shows a diagram for the leakage current density (J) versus electric field intensity (E) in the second embodiment of the present invention and the comparative example.

FIG. 7 shows a diagram for the leakage current density (J) versus electric field intensity (E) in the second embodiment and the comparative example 1. Taking the voltage value of 1V as an illustrative example, when the electric field is 2 MV/cm, the leakage currents in the comparative example 1 and the second embodiment are $3.7 \times 10^{-4}$ A/cm$^2$ and $3.9 \times 10^{-7}$ A/cm$^2$, respectively, which shows that the second preferred embodiment of the present invention, which utilizes the first metal-oxide film as an interface template and then sputters the second metal-oxide film, can substantially reduce the leakage current.

Figure 8:
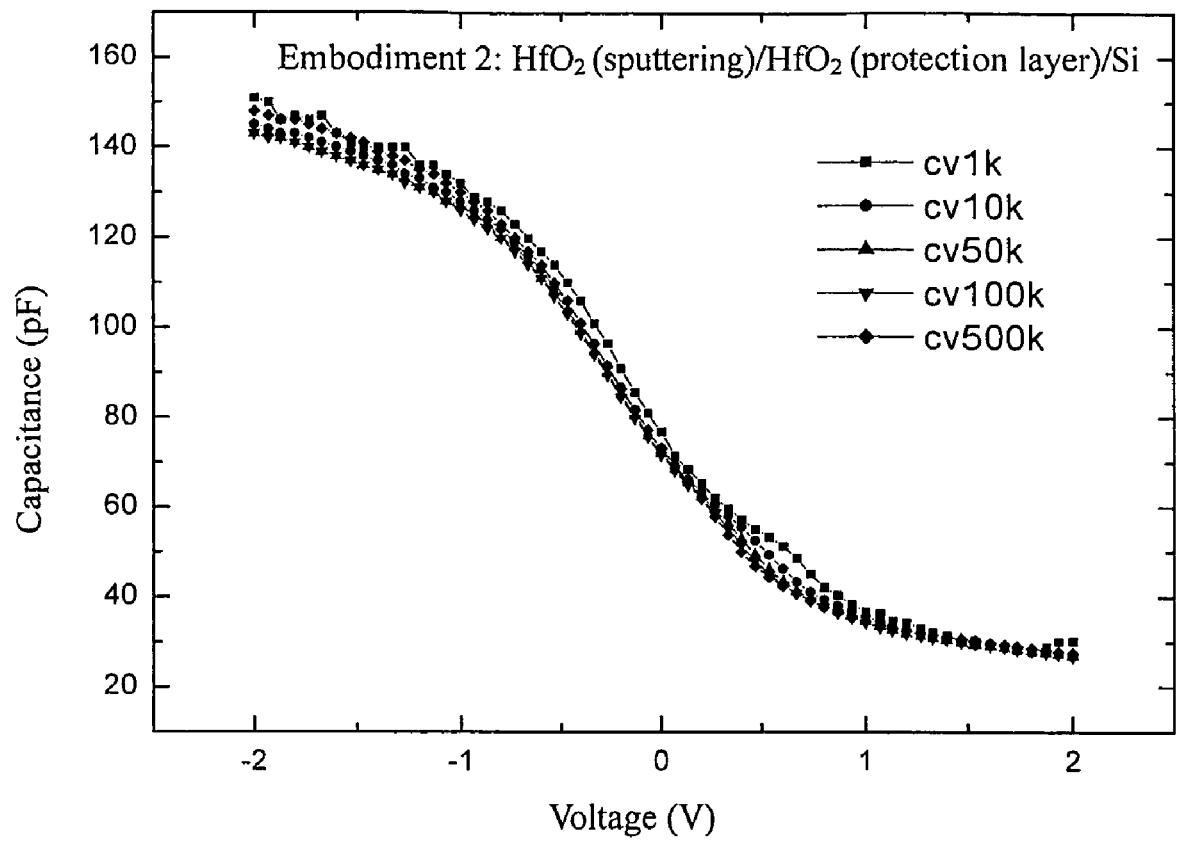
FIG. 8 shows a diagram for the capacity (C) versus voltage (V) in the second embodiment of the present invention.

FIG. 8 shows analysis diagrams for the capacitance (C) versus voltage (V) in the second embodiment when the measurement frequencies are 1 k, 10 k, 50 k, 100 k, and 500 k (Hz), respectively. Taking the measurement results of 1 kHz frequency as an illustrative example, the measured capacitance is $151 \times 10^{-12}$ Faraday (F), and it can be derived, by some calculations, that the value of the dielectric constant is approximately equal to 13.4, the value of EOT is approximately equal to 1.78 nm, where the dielectric constant (k) is derived by using the capacitance formula of parallel capacitor's plates: $C = k \epsilon_0 A/d$ (where capacitance $C=151$ pF, dielectric constant in vacuum $\epsilon_0 = 8.85 \times 10^{-14}$ Fcm$^{-1}$, area=$0.785 \times 10^{-4}$ cm$^2$, and thickness of the file d=5.46 nm are known values). EOT=$d \times k_{SiO2}/k$ ($k_{SiO2}$ is the dielectric of silicon dioxide, which is equal to 3.9; k is the value of the dielectric constant derived by using the above-mentioned calculation).

Embodiment 3

A third preferred embodiment of the inventive method for forming a substrate for MOS transistors is described as follows.

First, deposit a first metal-oxide film (aluminum oxide film or hafnium oxide film) on top of a single crystal silicon base by using the same step as described in the first preferred embodiment (but in the present embodiment the vaporizing source is replaced by aluminum oxide), and then transfer the test specimen to the ALCVD system so as to stack a second metal-oxide film (aluminum oxide film) on top of it. In the ALCVD film formation process of the third embodiment, the precursor used is commercial tri-methyl-aluminum (abbreviated to TMA, its chemical formula is Al(CH$_3$)$_3$), Tetrakisehylmethylamino-hafnium (abbreviated to TEMAH, its chemical formula is Hf(NEtMe)$_4$, and water (H$_2$O). The operating pressure is approximately 1 Torr, the operating temperature is about 300° C., and the measurement structure of the electrical properties is: metal layer (Ti—Au)/metal-oxide film (Al$_2$O$_3$)/semiconductor layer (single silicon base)/metal layer (Ti—Au).

Figure 9:
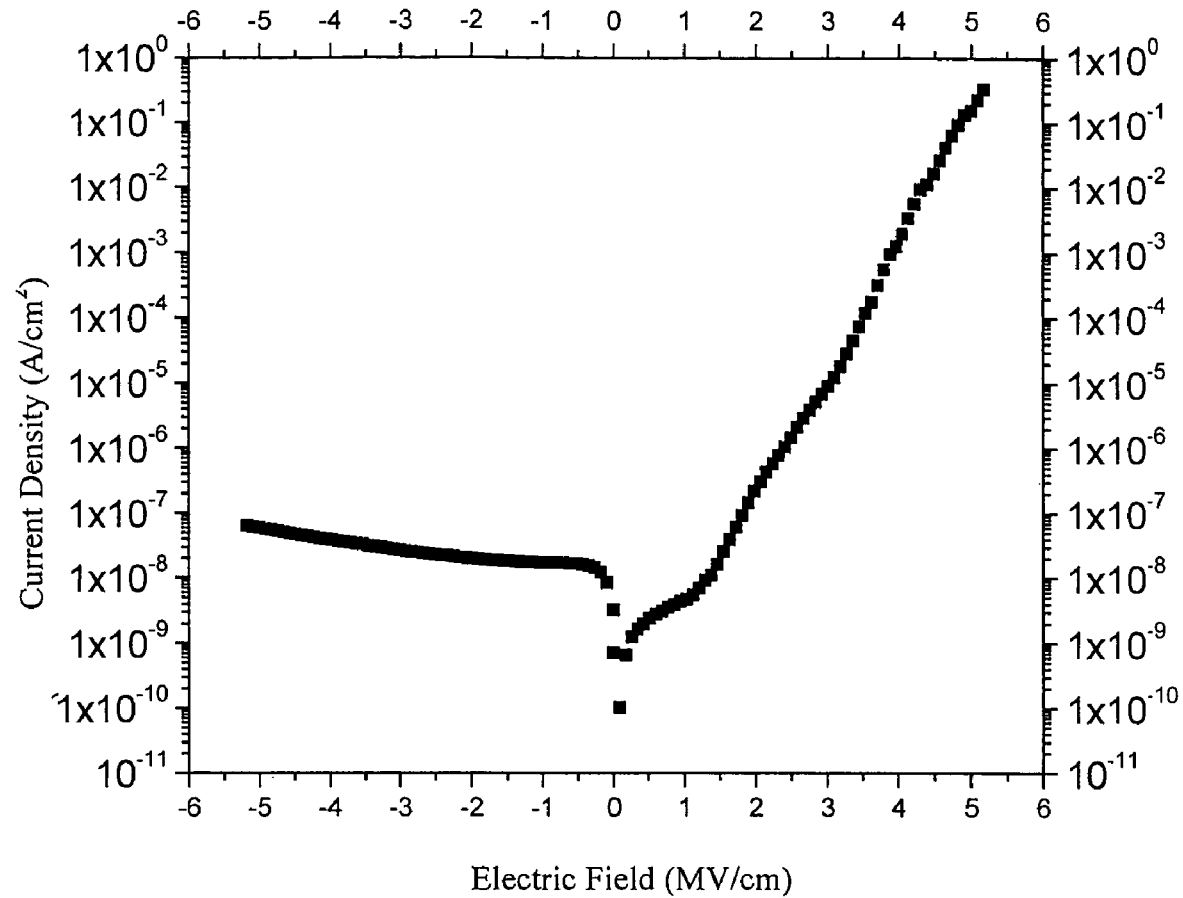
FIG. 9 shows a diagram for the leakage current density (J) versus electric field intensity (E) in a third embodiment of the present invention.

FIG. 9 shows an analysis diagram for the leakage current density (J) versus electric field intensity (E) in the third embodiment. Taking the voltage value of 1V as an illustrative example, when the electric field is 2 MV/cm, the leakage current is $3.05 \times 10^{-4}$ A/cm$^2$.

Figure 10:
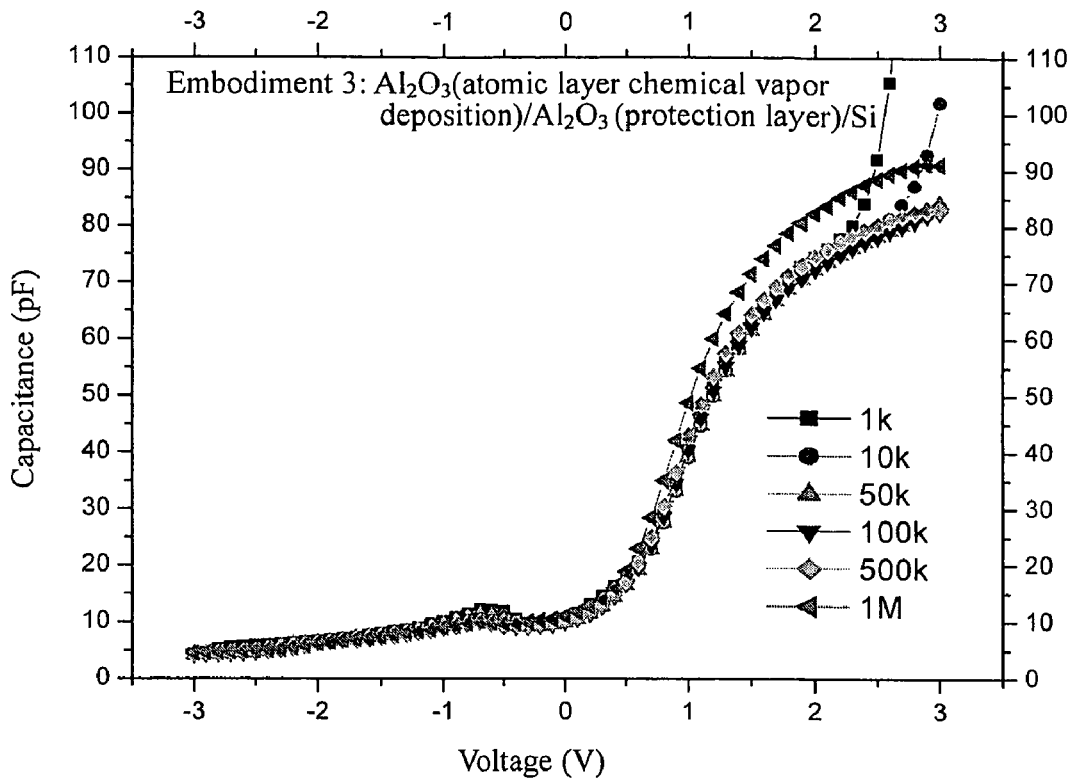
FIG. 10 shows a diagram for the capacity (C) versus voltage (V) in the third embodiment of the present invention.

FIG. 10 shows analysis diagrams for the capacitance (C) versus voltage (V) in the second embodiment when the measurement frequencies are 1 k, 10 k, 50 k, 100 k, and 500 k (Hz), respectively. The measured capacitance is $90 \times 10^{-2}$ Faraday (F), and it can be derived by some calculation that the value of the dielectric constant (k) is approximately equal to 7.5, where the dielectric constant (k) is derived by using the capacitance formula of parallel capacitor's plates: $C = k \epsilon_0 A/d$ (where capacitance $C = 151$ pF, dielectric constant in vacuum $\epsilon_0 = 8.85 \times 10^{-14}$ Fcm$^{-1}$, area=$0.785 \times 10^{-4}$ cm$^2$, and thickness of the file d=5.46 nm are known values).

Figure 11:
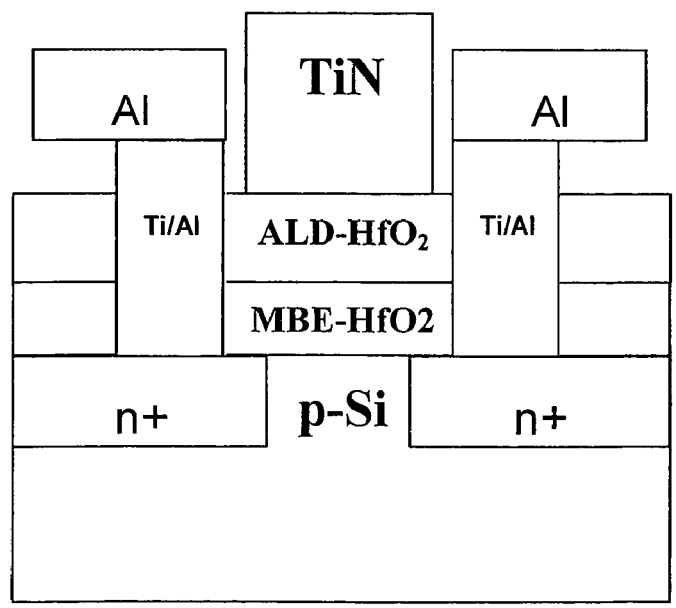
FIG. 11 shows the structure of a device of thinner gate dielectrics.

Furthermore, FIG. 11 shows a structure of a device of thinner gate dielectrics (ALD(4 nm)/MBE (2 nm) HfO$_2$) showing further enhancement of I$_D$ of 155 mA/mm at V$_G$ of 2.5V (in comparison, I$_D$ of 70 mA/mm at V$_G$ of 2.5 V for the 10 nm composite), and a gm of 100 mS/mm.

Figure 12:
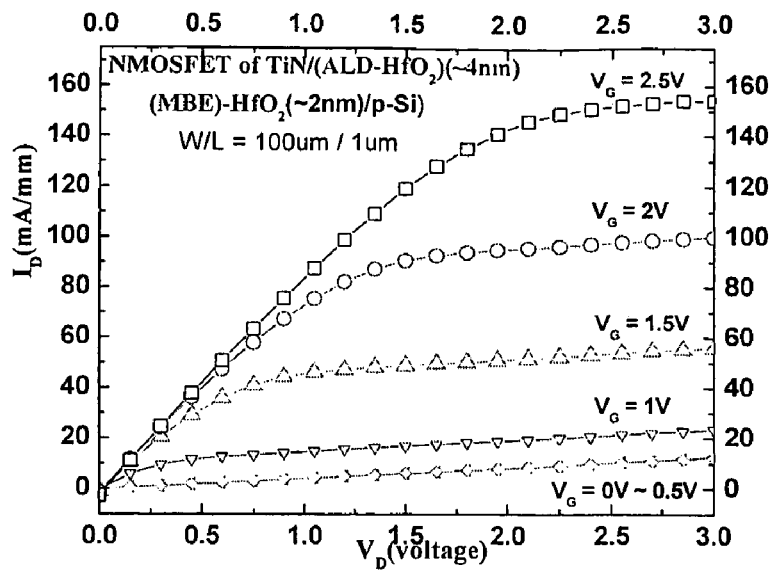
FIG. 12 shows a diagram for $I_D$-$V_D$ of TiN/ALD-HfO$_2$/MBE-HfO$_2$/p-Si NMOSFET of the device of thinner gate dielectrics.
Figure 13:
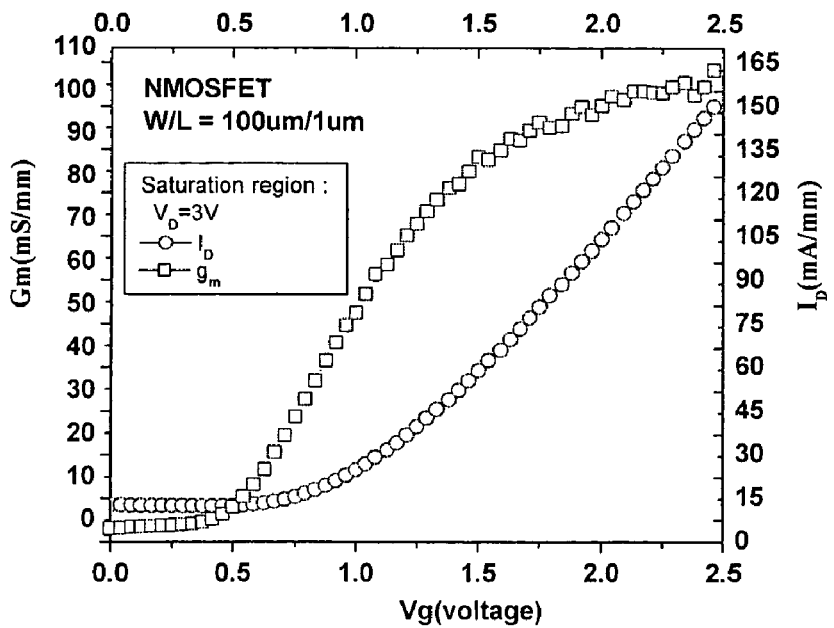
FIG. 13 shows a diagram for $I_D$-$V_g$ of TiN/ALD-HfO$_2$/MBE-HfO$_2$/p-Si NMOSFET of the device of thinner gate dielectrics.

FIGS. 12, 13 show no leakage currents at the linear region of small V$_D$, indicating the robustness of the novel HfO2 composite against the high temperature activation annealing. FIG. 12 shows an analysis diagram for I$_D$-V$_D$ of TiN/ALD-HfO$_2$ (4 nm)/MBE-HfO$_2$(2 nm)/p-Si NMOSFET(W/L=100/1 μm) of the device of thinner gate dielectrics. FIG. 13 shows an analysis diagram for I$_D$-V$_g$ of TiN/ALD-HfO$_2$ (4 nm)/MBE-HfO$_2$(2 nm)/p-Si NMOSFET(W/L=100/1 μm) of the device of thinner gate dielectrics.

Table 1 shows the process flow of self aligned MOSFET's with TiN metal gate and MBE+ALD HfO$_2$ gate dielectrics.

TABLE 1

Active area formation (LOCOS)
HF (1:100) cleaning
MBE-HfO$_2$ template deposition
ALD-HfO$_2$ growth
TiN metal gate deposition
Gate region patterning
Dry etching by HDP-RIE
S/D implantation: As(30 KeV, 3E15)
S/D activation: RTA 700° C., N$_2$, 20 s
S/D region patterning
HfO$_2$ etching
Contact metal deposition
Post-annealing: 400° C., FG, 30 min Embodiment 4

A fourth preferred embodiment of the inventive method for forming a substrate for MOS transistors is described as follows.

Put a gallium-arsenide base having a crystal plane index equal to 100 into a first chamber of a multi-chamber ultra high vacuum molecular beam epitaxy system so as to perform the surface reconstruction for the base. In the fourth preferred embodiment, the background pressure of the first cavity chamber is approximately equal to $10^{-11}$ Torr. Firstly, remove the native oxide layer by means of raising the temperature of the test specimen to 600° C. to 610° C., and use the on-the-spot RHEED image to monitor the surface appearance of the test specimen until the diffraction diagram shows a (2×4) reconstructed RHEED pattern. Then, use the molecular beam vaporization to grow a gallium-arsenide epitaxial film having a thickness of about 100 nm to 200 nm, and use silicon serving as a dopant to dope the gallium-arsenide film so that it has a doping concentration approximately equal to $4 \times 10^{17}$ cm$^{-3}$ (in order to increase the conductivity of the semiconductor). During the epitaxial growing process of the gallium-arsenide epitaxial film, the operating temperature of the base is ranging approximately from 590° C. to 600° C., and the operating pressure is approximately equal to $10^{-8}$ Torr.

Furthermore, transfer the test specimen on-the-spot to a second chamber having a pure powder-packed hafnium-oxide vapor source. The transferring process is performed under an ultra-high vacuum condition ($10^{-10}$ Torr) so as to prevent the test specimen from contaminating by impurities. The background pressure of the second chamber is approximately equal to $10^{-11}$ Torr. Before vaporizing the vapor deposition source, heat the test specimen until its temperature is approximately higher than 550° C. in order to achieve a (4×6) Ga-stabilized RHEED pattern so as to be advantageous for the subsequently grown hafnium-oxide film on the surface of the base to be performed in an As-free environment. When the temperature of the test specimen is cooled down to the room temperature, vaporize the hafnium-oxide vapor deposition source in order to deposit an amorphous hafnium-oxide film on the surface of the base. During the film formation process of the amorphous hafnium-oxide film, the operating temperature is ranging approximately from $10^{-7}$ Torr to $10^{-8}$ Torr.

Because the hafnium oxide is directly vaporized by the electron beam and then the hafnium oxide is deposited on the surface of the base in the form of molecular beams formed by the micelles, therefore it is able to prevent the surface of the gallium arsenide from oxidizing and forming a chemical compound such as arsenic oxide (AsO$_x$) and gallium oxide (GaO$_y$); hence a unique and abrupt hetero-junction without an intermediate layer can be obtained. The measurement structures of the electrical properties are all: metal layer (Au)/metal-oxide film (HfO$_2$)/semiconductor layer (gallium-arsenide base)/metal layer (Au).

Figure 14:
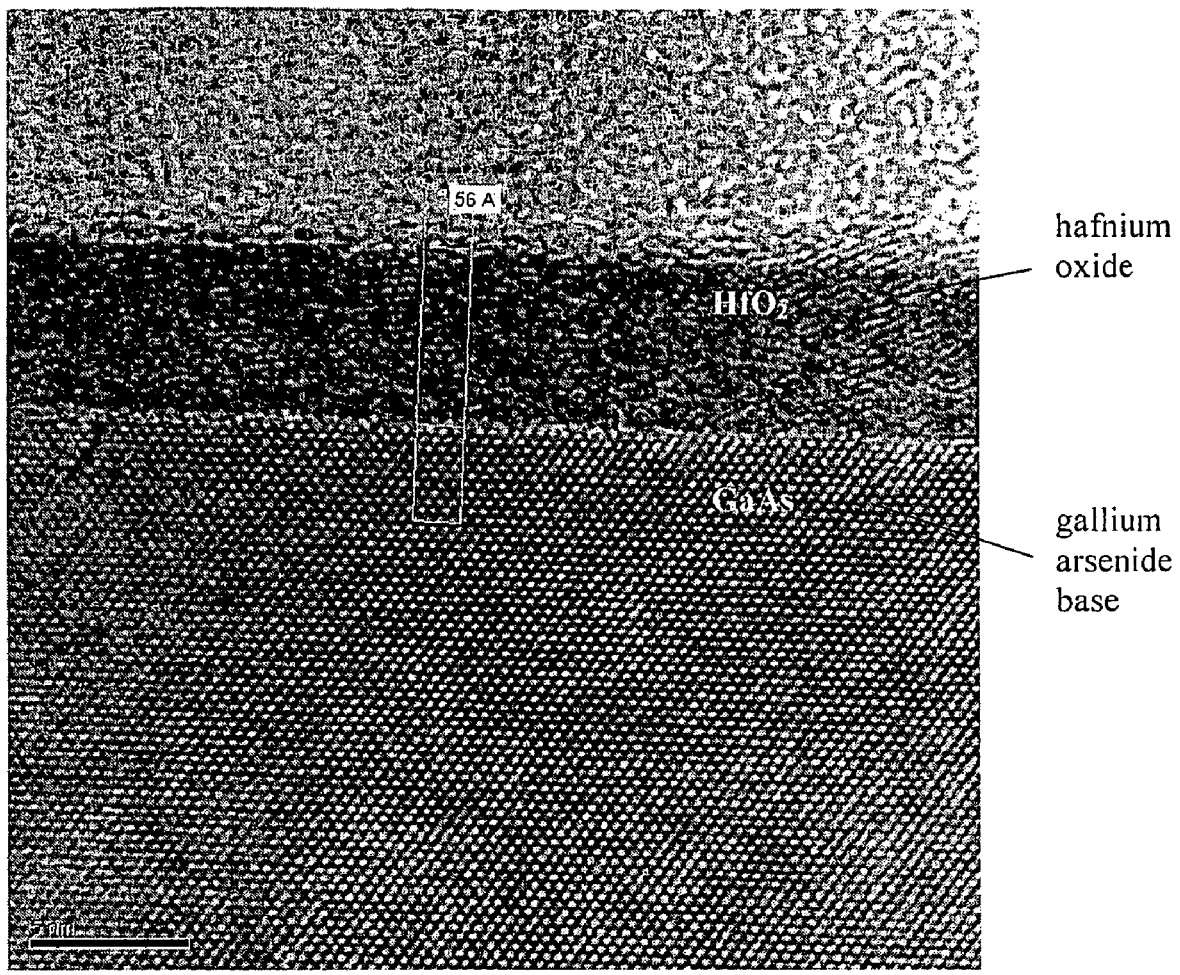
FIG. 14 shows a High Resolution Transmission Electron Microscopy (HRTEM) image in a fourth embodiment of the present invention.

The result of the roughness of the junction in the fourth embodiment can be obviously seen from the HRTEM image shown in FIG. 14: There is an abrupt interface template at the hetero-junction between the hafnium-oxide film (approximately 5.6 nm) and the gallium arsenide, and the roughness is approximately equal to the thickness of a single atomic layer, which is very flat; moreover, no intermediate layer is formed in between the hafnium-oxide film and the gallium arsenide.

Figure 15:
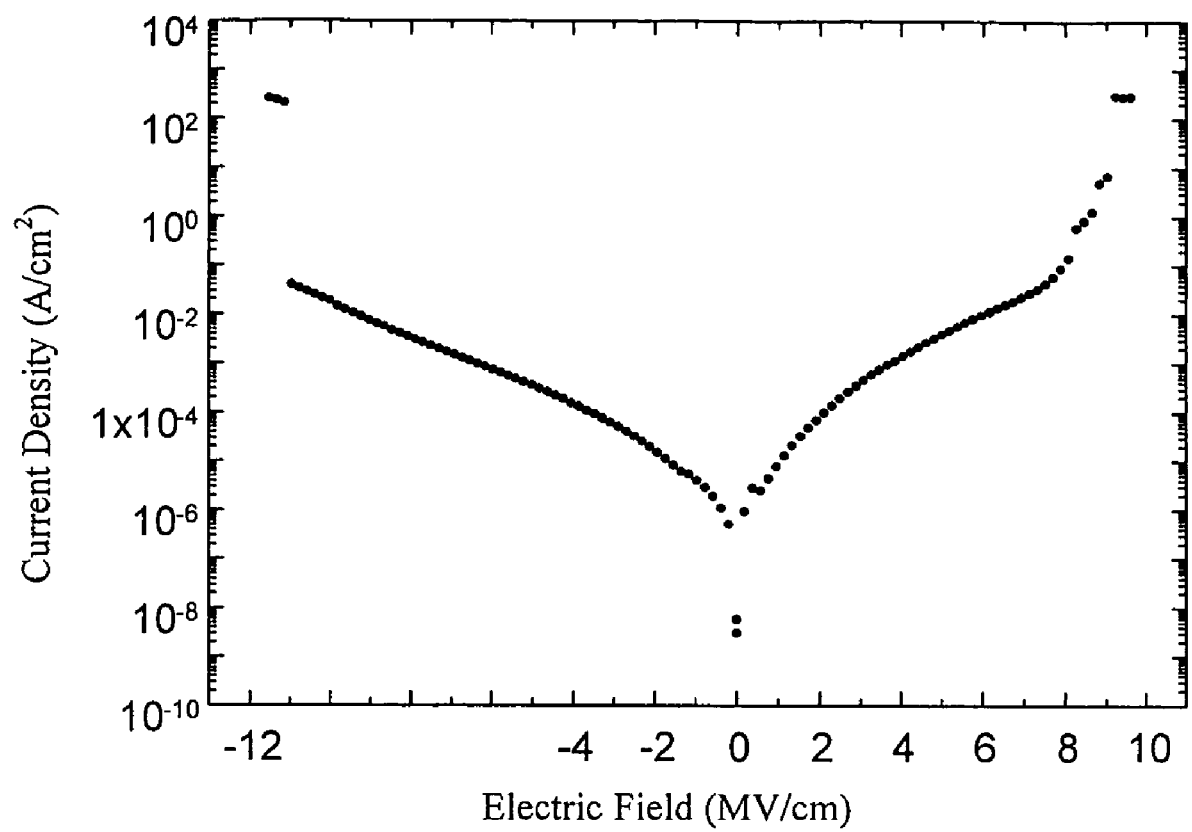
FIG. 15 shows a diagram for the leakage current density (J) versus electric field intensity (E) in the fourth embodiment of the present invention.

FIG. 15 shows a test result of the electrical property in the fourth preferred embodiment. When the electric field intensity is equal to 1 MV/cm, the leakage current of the test specimen is equal to $10^{-5}$ A/cm$^2$.

To sum up the above description, the inventive method for forming a substrate for MOS transistors and its products are able to form a metal-oxide film having a high dielectric constant on top of a single crystal semiconductor base, and can substantially reduce the thickness of the interfacial layer, or even no native oxide film exists. Consequently, the leakage current of MOS transistors can be reduced, indicating that the objectives of the present invention are actually achieved.

Although the present invention is disclosed in the preferred embodiments described above, the inventive idea should not be limited only to those. The present invention can also be applied to digital television satellite broadcast, high-speed Ethernet network, high-speed wireless local area network, and wireless metropolitan network, etc. It will be understood by those skilled in the art that various other changes in the form and details may be made without departing from the spirit and scope of the present invention. It is to be understood that various changes may be made in adapting to different embodiments without departing from the broader concepts disclosed herein and comprehended by the claims that follow.

The invention claimed is:

1. A method for forming substrates for MOS (metal oxide semiconductor) transistor, comprising the following steps:
   (A) in a reduced-pressure environment having a pressure lower than $1\times10^{-6}$ Torr, a base for accomplishing the surface reconstruction and a solid-state metal oxide source is provided, wherein the solid-state metal oxide source is chosen from the group consisting of the following: hafnium oxide, aluminum oxide, scandium oxide, yttrium oxide, titanium oxide, gallium gadolinium oxide and metal oxides of rare earth elements; and
   (B) in one step process, vaporize the solid-state metal oxide source in order to make the solid-state metal oxide source become a metal oxide molecular beam and, in a operating temperature that is required for achieving an amorphous state of the solid-state metal oxide films, deposit on the base a first metal oxide film having an amorphous state so as to further fabricate a substrate for MOS transistors.

2. A method for forming substrates for MOS transistor in accordance with claim 1, in which the solid-state metal oxide in the step (A) is one of the hafnium oxide and aluminum oxide.

3. A method for forming substrates for MOS transistor in accordance with claim 1, in which the operating temperature is ranging from 25° C. to 100° C.

4. A method for forming substrates for MOS transistor in accordance with claim 3, in which the solid-state metal oxide source is vaporized by an electron gun in the step (B).

5. A method for forming substrates for MOS transistor in accordance with claim 1, wherein the base in the step (A) is one of the single crystal silicon and single crystal compound semiconductors, in which the single crystal compound semiconductor consists of a Group 13 element and a Group 15 element, in which the Group 13 element is selected from the group comprising the following: boron, aluminum, gallium, indium, thallium and a combination thereof; and the Group 15 element is selected from the group comprising the following: nitrogen, phosphorus, arsenic, antimony, bismuth, and a combination thereof.

6. A method for forming substrates for MOS transistor in accordance with claim 5, in which the base in the step (A) is single crystal silicon.

7. A method for forming substrates for MOS transistor in accordance with claim 5, in which the base in the step (A) is a monocrystalline compound semiconductor, the Group 13 element is gallium, and the Group 15 element is arsenic.

8. A method for forming substrates for MOS transistor in accordance with claim 4, further comprising a step (C) following the step (B), wherein the step (C) is to stack a second metal-oxide film over the first metal-oxide film.

9. A method for forming substrates for MOS transistor in accordance with claim 8, in which the second metal-oxide film is selected from the group consisting of the following: hafnium oxide, aluminum oxide, scandium oxide, yttrium oxide, titanium oxide, gallium gadolinium oxide and metal-oxides of rare earth elements.

10. A method for forming substrates for MOS transistor in accordance with claim 8, in which, in the step (C), the second metal-oxide film is being stacked over the first metal-oxide film by the radio frequency (RF) sputtering method, wherein the sputtering energy of the RF sputtering method is absorbed by the base so as to form an interfacial oxide film, with a thickness less than 1.8 nm, between the base and the first metal-oxide film.

11. A method for forming substrates for MOS transistor in accordance with claim 10, in which the thickness of the interfacial oxide film is ranging from 0.3 nm to 1.8 nm.

12. A method for forming substrates for MOS transistor in accordance with claim 10, in which the operating temperature of the step (C) is ranging from 25° C. to 300° C.

13. A method for forming substrates for MOS transistor in accordance with claim 12, in which the operating temperature of the step (C) is ranging from 150° C. to 250° C.

14. A method for forming substrates for MOS transistor in accordance with claim 10, in which the RF sputtering method of the step (C) is to apply an output power ranging from 20 W to 100 W over a metal-oxide target material.

15. A method for forming substrates for MOS transistor in accordance with claim 14, in which the output power is ranging from 30 W to 60 W.

16. A method for forming substrates for MOS transistor in accordance with claim 10, in which the operating pressure of the step (C) is ranging from 5 mTorr to 50 mTorr.

17. A method for forming substrates for MOS transistor in accordance with claim 16, in which the operating pressure of the step (C) is ranging from 5 mTorr to 30 mTorr.

18. A method for forming substrates for MOS transistor in accordance with claim 8, in which, in the step (C), the second metal oxide film is stacked over the first metal oxide film by using the atomic layer chemical vapor deposition method.

19. A method for forming substrates for MOS transistor in accordance with claim 18, in which the operating temperature of the step (C) is ranging from 25° C. to 400° C.

20. A method for forming substrates for MOS transistor in accordance with claim 19, in which the operating temperature of the step (C) is ranging from 200° C. to 300° C.

21. A method for forming substrates for MOS transistor in accordance with claim 10, in which the operating pressure of the step (C) is ranging from 0.1 Torr to 10 Torr.

22. A method for forming substrates for MOS transistor in accordance with claim 7, further comprising successively a step (A') and a step (A") between the step (A) and the step (B), in which in the step (A'), a single crystal gallium arsenide film, which is doped with a dopant having a doping concentration of $5 \times 10^{15}$ to $3 \times 10^{18}/cm^3$ in n-type and $5 \times 10^{15}$ to $2 \times 10^{19}/cm3$ in p-type is epitaxially grown on the base with a thickness ranging from 50 nm to 250 nm; in the step (A"), a surface reconstruction is applied over the single crystal gallium arsenide film.

23. A method for forming substrates for MOS transistor in accordance with claim 22, in which, in the step (A'), the thickness of the single crystal gallium arsenide film is ranging from 100 nm to 200 nm, whereas the doping concentration is the same as in claim 22.

24. A method for forming substrates for MOS transistor in accordance with claim 1, in which, in the step (A), the pressure of the reduced pressure environment is ranging from $1 \times 10^{-7}$ Torr to $1 \times 10^{-10}$ Torr.

25. A method for forming substrates for MOS transistor in accordance with claim 24, in which, in the step (A), the pressure of the reduced pressure environment is ranging from $1 \times 10^{-8}$ Torr to $1 \times 10^{-10}$ Torr.

26. A substrate for MOS transistor, which is manufactured by claim 1.

* * * * *